US009460815B2

(12) United States Patent
Sivasankaran et al.

(10) Patent No.: US 9,460,815 B2
(45) Date of Patent: Oct. 4, 2016

(54) REUSING PARTIAL BAD BLOCKS IN NAND MEMORY

(71) Applicant: SanDisk Technologies Inc., Plano, TX (US)

(72) Inventors: Vijay Sivasankaran, Bangalore (IN); Vivek Shivhare, Bangalore (IN); Abhijeet Manohar, Bangalore (IN)

(73) Assignee: SanDisk Technologies LLC, Plano, TX (US)

( * ) Notice: Subject to any disclaimer, the term of this patent is extended or adjusted under 35 U.S.C. 154(b) by 0 days.

(21) Appl. No.: 14/261,750

(22) Filed: Apr. 25, 2014

(65) Prior Publication Data

US 2015/0187442 A1    Jul. 2, 2015

(30) Foreign Application Priority Data

Dec. 30, 2013  (IN) .......................... 6168/CHE/2013

(51) Int. Cl.
| | |
|---|---|
| *G11C 16/06* | (2006.01) |
| *G11C 29/00* | (2006.01) |
| *G11C 16/10* | (2006.01) |
| *G11C 16/04* | (2006.01) |

(52) U.S. Cl.
CPC ......... *G11C 29/765* (2013.01); *G11C 16/0483* (2013.01); *G11C 16/10* (2013.01); *G11C 29/70* (2013.01); *G11C 29/76* (2013.01); *G11C 29/82* (2013.01); *G11C 29/88* (2013.01)

(58) Field of Classification Search
CPC ....................................................... G11C 29/70
USPC ....................................................... 365/185.09
See application file for complete search history.

(56) References Cited

U.S. PATENT DOCUMENTS

| | | | |
|---|---|---|---|
| 6,285,607 B1 | 9/2001 | Sinclair | |
| 8,886,990 B2 * | 11/2014 | Meir | G06F 12/0246 714/6.1 |
| 2010/0172179 A1 * | 7/2010 | Gorobets | G06F 12/0246 365/185.09 |
| 2013/0326312 A1 * | 12/2013 | Lee et al. | 714/773 |
| 2013/0336059 A1 | 12/2013 | Lee et al. | |
| 2015/0003156 A1 * | 1/2015 | Berckmann | G11C 29/88 365/185.09 |

* cited by examiner

*Primary Examiner* — Son Mai
(74) *Attorney, Agent, or Firm* — Brinks Gilson & Lione

(57) ABSTRACT

A system handles bad blocks in block-based NAND memory by remapping wordlines that are unusable. Rather than eliminate usage of an entire block, the system may dynamically remap the block to exclude only the unusable wordlines. The partial blocks utilize portions of the memory with good wordlines and the portions of memory with bad wordlines are redirected to one or more replacement blocks.

11 Claims, 6 Drawing Sheets

REUSING PARTIAL BAD BLOCKS IN NAND MEMORY

PRIORITY

This application claims priority to India Application Number 6168/CHE/2013, filed on Dec. 30, 2013, entitled "REUSING PARTIAL BAD BLOCKS IN NAND MEMORY", the entire disclosure of which is herein incorporated by reference.

TECHNICAL FIELD

This application relates generally to memory devices. More specifically, this application relates to evaluating blocks of NAND memory in order to identify bad blocks which are dynamically remapped for reuse.

BACKGROUND

Non-volatile memory systems, such as flash memory, have been widely adopted for use in consumer products. Flash memory may be found in different forms, for example in the form of a portable memory card that can be carried between host devices or as a solid state disk ("SSD") embedded in a host device. Flash memory may be written in pages and erased in blocks, so once a page is written, a rewrite may require the whole block to be erased. The memory device firmware may handle memory in logical groups and the logical to physical address table (i.e. the global address table or "GAT") may have an entry for each logical group. Identification of which memory is bad may be necessary for decreasing the risk of losing stored data. For example, memory blocks that are identified as bad may be avoided entirely while good blocks or blocks that are not identified as bad may be used without restrictions. However, avoiding an entire memory block may unnecessarily reduce the overall capacity of the memory. Bad blocks may be replaced with spare blocks, but that also reduces the overall memory capacity, and an insufficient number of spare blocks on a particular die may result in the memory not being able to replace a particular bad block.

SUMMARY

It may be desirable to dynamically remap portions of a bad blocks rather than eliminate usage of the entire block. A block may include both good and bad data and rather than exclude all data from a block with bad data, the remapping can be used for the partial bad blocks. In particular, unusable wordlines in NAND memory may be identified and dynamically remapped.

BRIEF DESCRIPTION OF THE PRESENTLY PREFERRED EMBODIMENTS

Figure 1:
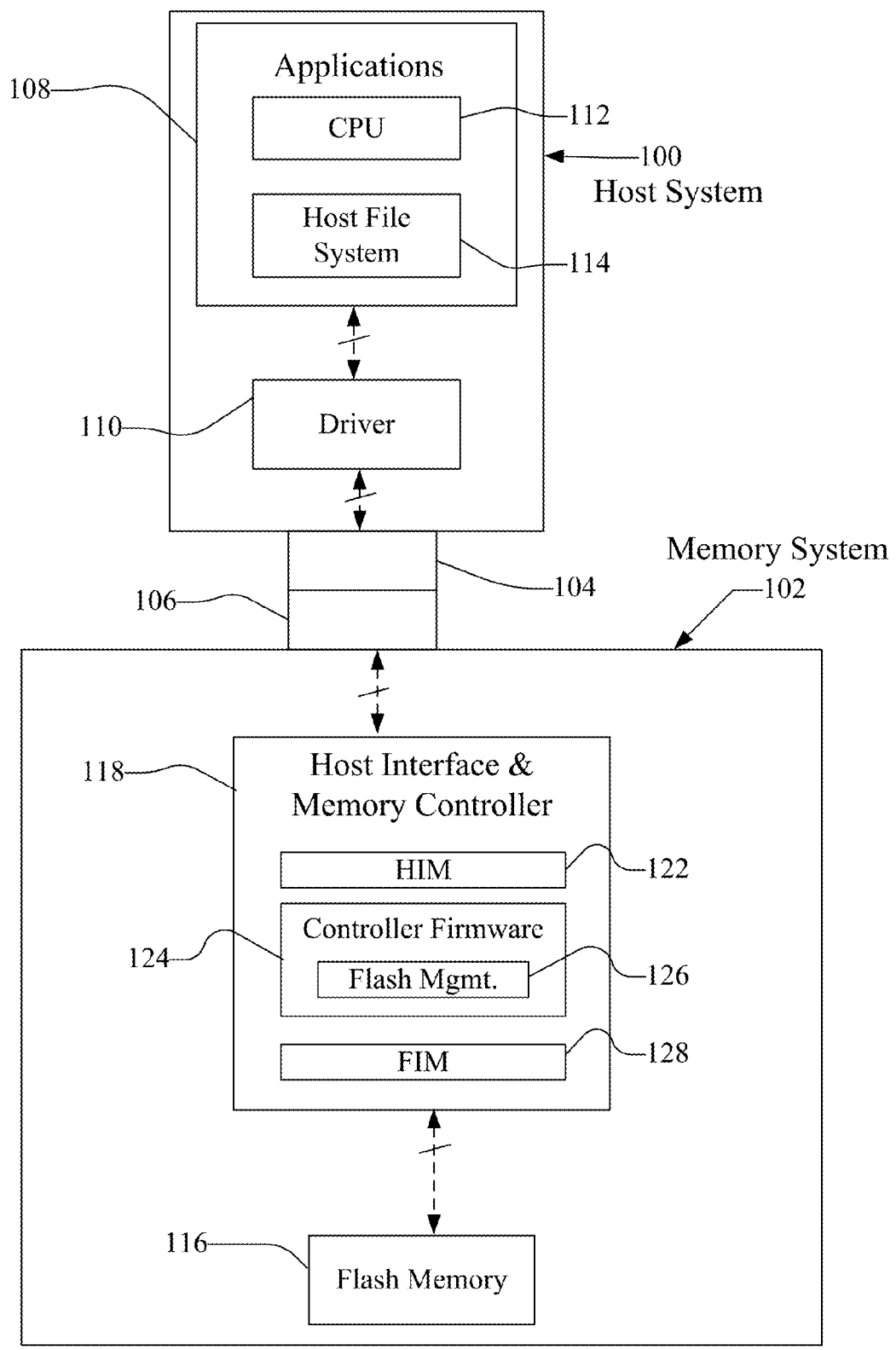
FIG. 1 is a block diagram of a host connected with a memory system having non-volatile memory.

A flash memory system suitable for use in implementing aspects of the invention is shown in FIGS. 1-4. A host system 100 of FIG. 1 stores data into and retrieves data from a flash memory 102. The flash memory may be embedded within the host, such as in the form of a solid state disk (SSD) drive installed in a personal computer. Alternatively, the memory 102 may be in the form of a flash memory card that is removably connected to the host through mating parts 104 and 106 of a mechanical and electrical connector as illustrated in FIG. 1. A flash memory configured for use as an internal or embedded SSD drive may look similar to the schematic of FIG. 1, with one difference being the location of the memory system 102 internal to the host. SSD drives may be in the form of discrete modules that are drop-in replacements for rotating magnetic disk drives. As described, flash memory may refer to the use of a negated AND (NAND) cell that stores an electronic charge.

Examples of commercially available removable flash memory cards include the CompactFlash (CF), the MultiMediaCard (MMC), Secure Digital (SD), miniSD, Memory Stick, SmartMedia, TransFlash, and microSD cards. Although each of these cards may have a unique mechanical and/or electrical interface according to its standardized specifications, the flash memory system included in each may be similar. These cards are all available from SanDisk Corporation, assignee of the present application. SanDisk also provides a line of flash drives under its Cruzer trademark, which are hand held memory systems in small packages that have a Universal Serial Bus (USB) plug for connecting with a host by plugging into the host's USB receptacle. Each of these memory cards and flash drives includes controllers that interface with the host and control operation of the flash memory within them.

Host systems that may use SSDs, memory cards and flash drives are many and varied. They include personal computers (PCs), such as desktop or laptop and other portable computers, tablet computers, cellular telephones, smartphones, personal digital assistants (PDAs), digital still cameras, digital movie cameras, and portable media players. For portable memory card applications, a host may include a built-in receptacle for one or more types of memory cards or flash drives, or a host may require adapters into which a memory card is plugged. The memory system may include its own memory controller and drivers but there may also be some memory-only systems that are instead controlled by software executed by the host to which the memory is connected. In some memory systems containing the controller, especially those embedded within a host, the memory, controller and drivers are often formed on a single integrated circuit chip. The host may communicate with the memory card using any communication protocol such as but not limited to Secure Digital (SD) protocol, Memory Stick (MS) protocol and Universal Serial Bus (USB) protocol.

The host system 100 of FIG. 1 may be viewed as having two major parts, insofar as the memory device 102 is concerned, made up of a combination of circuitry and software. An applications portion 108 may interface with the memory device 102 through a file system module 114 and driver 110. In a PC, for example, the applications portion 108 may include a processor 112 for running word processing, graphics, control or other popular application software. In a camera, cellular telephone that is primarily dedicated to performing a single set of functions, the applications portion 108 may be implemented in hardware for running the software that operates the camera to take and store pictures, the cellular telephone to make and receive calls, and the like.

The memory system 102 of FIG. 1 may include non-volatile memory, such as flash memory 116, and a device controller 118 that both interfaces with the host 100 to which the memory system 102 is connected for passing data back and forth and controls the memory 116. The device controller 118 may be implemented on a single integrated circuit chip, such as an application specific integrated circuit (ASIC). The device controller 118 may include a multi-thread processor capable of communicating via a memory interface 128 having I/O ports for each memory bank in the flash memory 116. The device controller 118 may include an internal clock. The processor of the device controller 118 may communicate with an error correction code (ECC) module, a RAM buffer, and a boot code ROM via an internal data bus.

The device controller 118 may convert between logical addresses of data used by the host 100 and physical addresses of the flash memory 116 during data programming and reading. Functionally, the device controller 118 may include a Host interface module (HIM) 122 that interfaces with the host system controller logic 110, and controller firmware module 124 for coordinating with the host interface module 122, and flash interface module (FIM) 128. Flash management logic 126 may be part of the controller firmware 124 for internal memory management operations such as garbage collection. One or more flash interface modules (FIMs) 128 may provide a communication interface between the controller with the flash memory 116.

A flash transformation layer ("FTL") or media management layer ("MML") may be integrated in the flash management 126 and may handle flash errors and interfacing with the host. In particular, flash management 126 is part of controller firmware 124 and FTL may be a module in flash management. The FTL may be responsible for the internals of NAND management. In particular, the FTL may be an algorithm in the memory device firmware which translates writes from the host 100 into writes to the flash memory 116. The FTL may be needed because: 1) the flash memory may have limited endurance; 2) the flash memory 116 may only be written in multiples of pages; and/or 3) the flash memory 116 may not be written unless it is erased as a block. The FTL understands these potential limitations of the flash memory 116 which may not be visible to the host 100. Accordingly, the FTL attempts to translate the writes from host 100 into writes into the flash memory 116. The FTL may include the logical block address ("LBA") map that translates addresses for the flash memory. An FTL algorithm may provide logical to physical address mapping which includes an algorithm to convert logical addresses from the file system to physical addresses of flash memory. The FTL may provide the remapping of memory with bad wordlines, such that an entire block is not marked as defective when it has bad wordlines. Rather, that block is a partial block but the memory associated with the bad wordlines is no longer used and remapped to one or more replacement blocks which substitute for the memory associated with the bad wordlines.

In one embodiment, the flash memory 116 may be considered to include multi-level cell (MLC) or single level cell (SLC) memory. The memory may be included as part of the device controller 118 rather than as part of the flash memory 116 in some embodiments. The flash memory 116 may be mostly MLC, while binary cache and update blocks may be SLC memory. Update blocks may be SLC memory with page based addressing or page based Logical Group (LG) organization. The LG size for the GAT may depend on the data. For example, sequential data may be indexed with a large LG size, while fragmented data may be indexed with a smaller LG size. In particular, the GAT may default to a large LG size, but reference additional GAT pages for fragmented data, where the additional GAT pages include a smaller LG size. The LG size for the GAT and additional GAT pages may occur at the FTL or flash management 126 of the controller 118.

Figure 2:
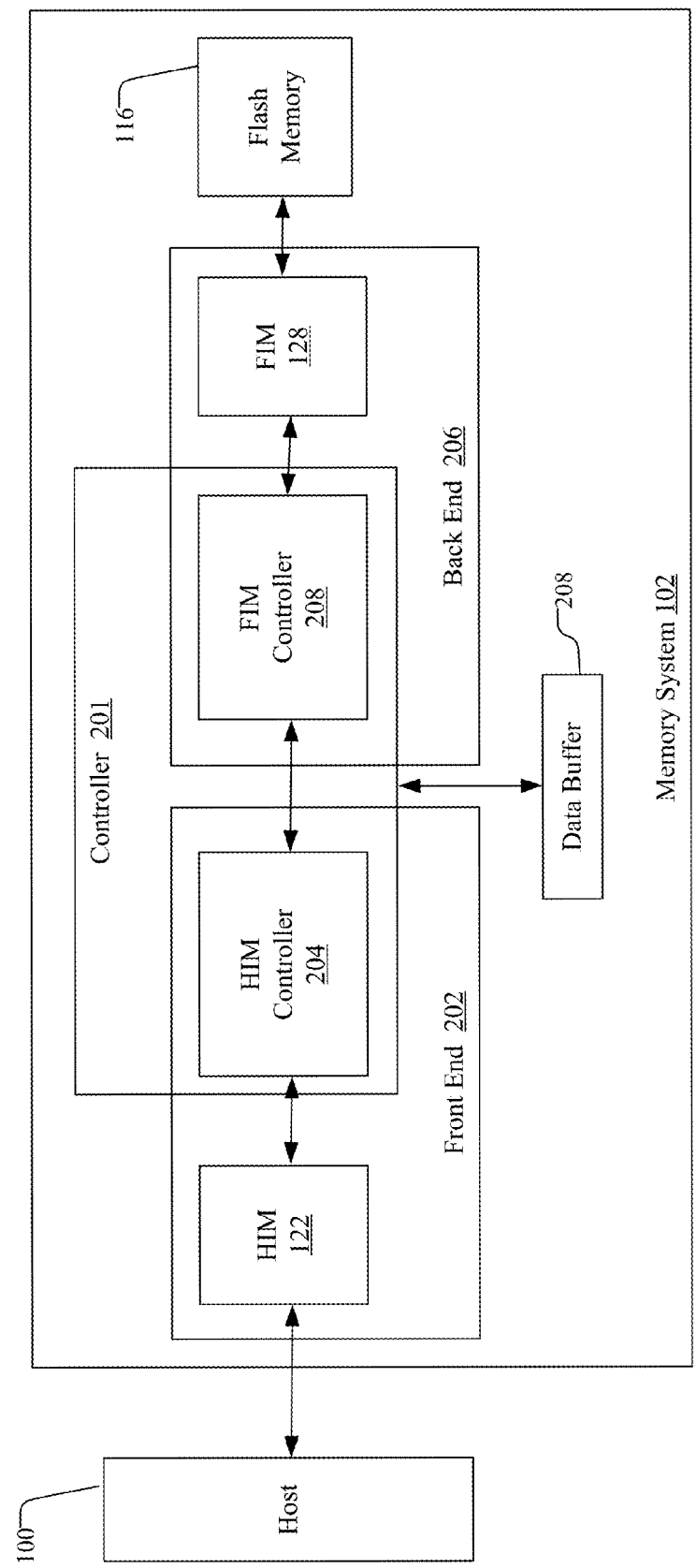
FIG. 2 is a block diagram of an alternative memory communication system.

FIG. 2 is a block diagram of an alternative memory communication system. The host system 100 is in communication with the memory system 102 as discussed with respect to FIG. 1. The memory system 102 includes a front end 202 in communication with the host and a back end 206 coupled with the flash memory 116. In one embodiment, the front end 202 and the back end 206 may be referred to as the memory controller and may be part of the device controller 118. The front end 202 may logically include a Host Interface Module (HIM) 122 and a HIM controller 204. The back end 206 may logically include a Flash Interface Module (FIM) 128 and a FIM controller 208. Accordingly, the controller 201 may be logically portioned into two modules, the HIM controller 204 and the FIM controller 208. The HIM 122 provides interface functionality for the host device 100, and the FIM 128 provides interface functionality for the flash memory 116. The controller 201 may be coupled with a data buffer 208.

In operation, data is received from the HIM 122 by the HIM controller 204 during a write operation of host device 100 on the memory system 102. The HIM controller 204 may pass control of data received to the FIM controller 208, which may include the FTL discussed above. The FIM controller 208 may determine how the received data is to be written onto the flash memory 116 optimally. The received data may be provided to the FIM 128 by the FIM controller 208 for writing data onto the flash memory 116 based on the determination made by the FIM controller 208. The FIM controller 208 and the FTL may operate the logical to physical mapping of memory stored in the flash memory 116. In particular, the FIM controller 208 may operate the addressing and remapping of a partial block as discussed below with respect to FIGS. 5-7.

Figure 3:
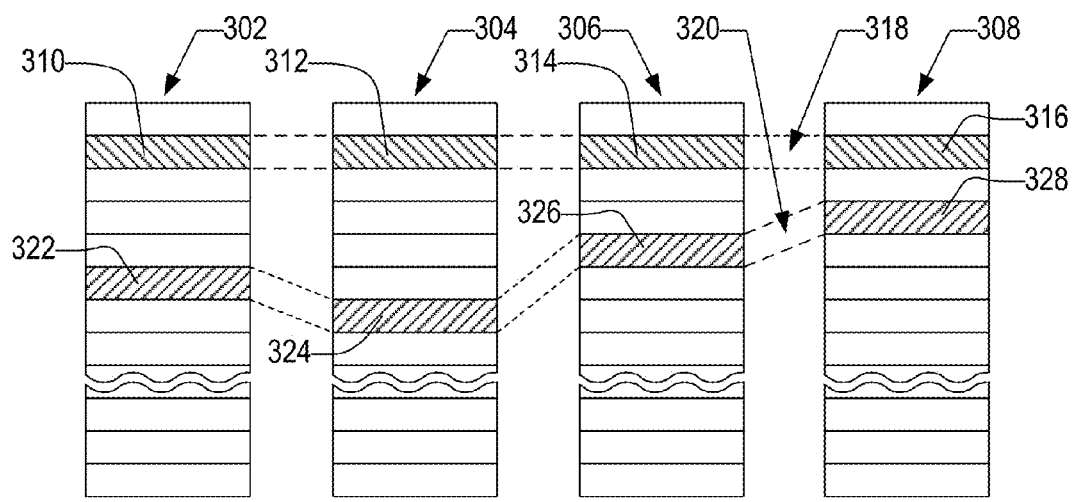
FIG. 3 is an example physical memory organization of the system of FIG. 1.

FIG. 3 conceptually illustrates an organization of the flash memory 116 (FIG. 1) as a cell array. The flash memory 116 may include multiple memory cell arrays which are each separately controlled by a single or multiple memory controllers 118. Four planes or sub-arrays 302, 304, 306, and 308 of memory cells may be on a single integrated memory cell chip, on two chips (two of the planes on each chip) or on four separate chips. The specific arrangement is not important to the discussion below. Of course, other numbers of planes, such as 1, 2, 8, 16 or more may exist in a system. The planes are individually divided into groups of memory cells that form the minimum unit of erase, hereinafter referred to as blocks. Blocks of memory cells are shown in FIG. 3 by rectangles, such as blocks 310, 312, 314, and 316, located in respective planes 302, 304, 306, and 308. There can be any number of blocks in each plane.

The block of memory cells is the unit of erase, and the smallest number of memory cells that are physically erasable together. For increased parallelism, however, the blocks may be operated in larger metablock units or chunks. One block from each plane is logically linked together to form a metablock. The four blocks 310, 312, 314, and 316 are shown to form one metablock 318. All of the cells within a metablock are typically erased together. The blocks used to form a metablock need not be restricted to the same relative locations within their respective planes, as is shown in a second metablock 320 made up of blocks 322, 324, 326, and 328. Although it is usually preferable to extend the metablocks across all of the planes, for high system performance, the memory system can be operated with the ability to dynamically form metablocks of any or all of one, two or three blocks in different planes. This allows the size of the metablock to be more closely matched with the amount of data available for storage in one programming operation.

Figure 4:
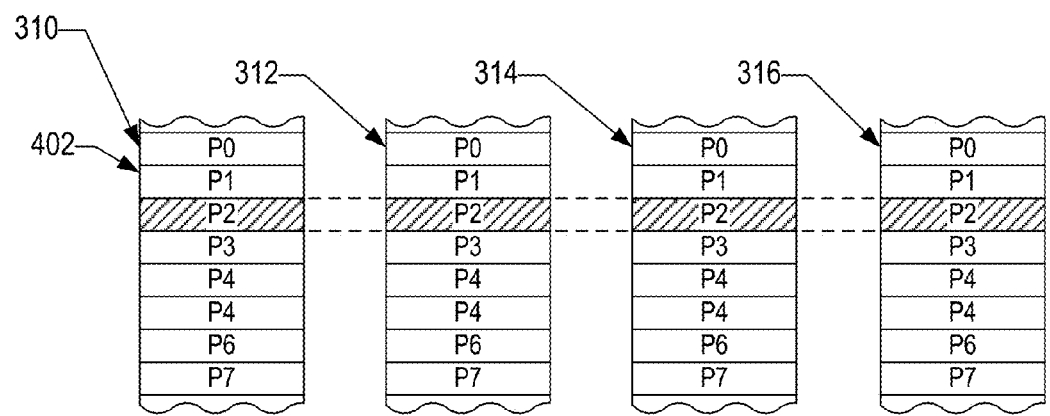
FIG. 4 is an expanded view of a portion of the physical memory of FIG. 3.

The individual blocks are in turn divided for operational purposes into pages of memory cells, as illustrated in FIG. 4. The memory cells of each of the blocks 310, 312, 314, and 316, for example, are each divided into eight pages P0-P7. Alternatively, there may be 16, 32 or more pages of memory cells within each block. The page is the unit of data programming and reading within a block, containing the minimum amount of data that are programmed or read at one time. However, in order to increase the memory system operational parallelism, such pages within two or more blocks may be logically linked into metapages. A metapage 402 is illustrated in FIG. 3, being formed of one physical page from each of the four blocks 310, 312, 314, and 316. The metapage 402, for example, includes the page P2 in each of the four blocks but the pages of a metapage need not necessarily have the same relative position within each of the blocks. A metapage may be the maximum unit of programming.

The memory cells may be operated to store two levels of charge so that a single bit of data is stored in each cell. This is typically referred to as a binary or single level cell (SLC) memory. SLC memory may store two states: 0 or 1. Alternatively, the memory cells may be operated to store more than two detectable levels of charge in each charge storage element or region, thereby to store more than one bit of data in each. This latter configuration is referred to as multi-level cell (MLC) memory. For example, MLC memory may store four states and can retain two bits of data: 00 or 01 and 10 or 11. Both types of memory cells may be used in a memory, for example binary SLC flash memory may be used for caching data and MLC memory may be used for longer term storage. The charge storage elements of the memory cells are most commonly conductive floating gates but may alternatively be non-conductive dielectric charge trapping material.

As described, bad blocks (blocks with unusable physical area for at least one or more wordlines) may be at least partially used. This increases the logical capacity of the memory by allowing the system to absorb more failed blocks. The partial bad blocks may include good storage space (good wordlines) and bad storage space (bad wordlines). The good storage space may still be used and the entire block is not disregarded as was done previously. The individual wordlines may be marked as bad rather than marking an entire block as bad because of one or more bad wordlines.

There may be a plurality of replacement blocks that are dynamically updated with data from bad wordlines in a partial block. The dynamic updating of the bad wordlines to a replacement block may be from the MML or FTL. For example, an algorithm in the FTL may remap the wordlines from a partial block to a replacement block. The remapping process is dynamic because the replacement block would be remapped in a garbage collection operation to ensure that the data stored in the replacement block(s) is valid replacement data. The replacement blocks store replacement data that would otherwise be stored in bad wordlines. Rather than rejecting the entire block (with the bad wordlines), this partial block utilizes the replacement block to replace the bad wordlines.

Figure 5:
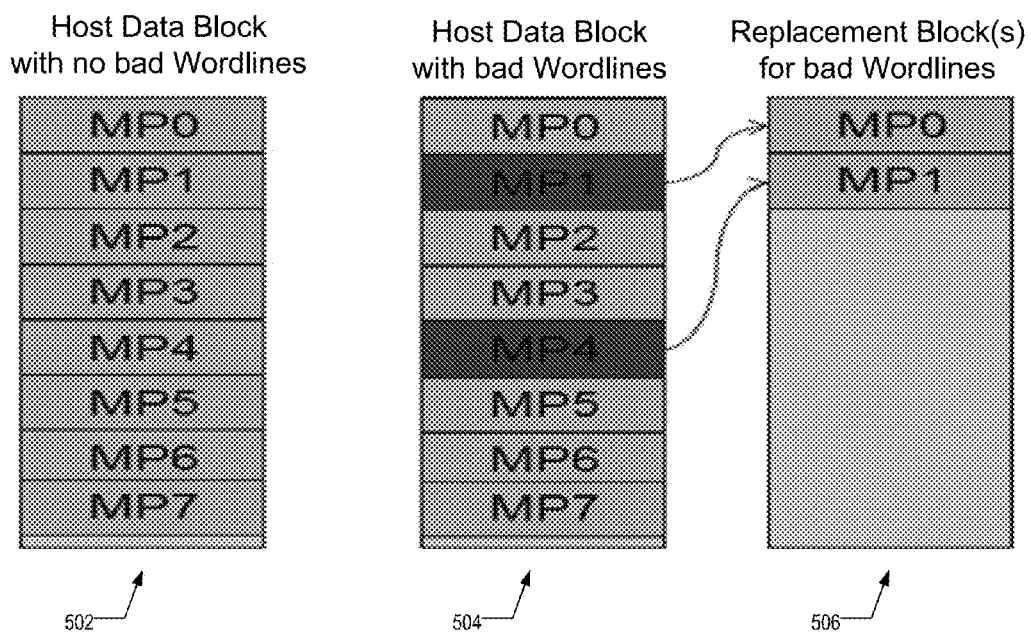
FIG. 5 is an illustration of a replacement block.

FIG. 5 is an illustration of a replacement block. In particular, FIG. 5 illustrates a host data block and the use of a replacement block for storing data. A host data block 502 with no bad wordlines does not utilize a replacement block. A host data block 504 with bad wordlines may need to use a replacement block. The replacement block 506 includes entries MP0 and MP1 which were from the two bad wordlines MP1 and MP4 from host data block 504. Although described as wordlines, the data may be from a metapage as shown in FIG. 5.

The replacement block 506 is used as a replacement for bad wordlines from non-replacement or regular data blocks. This enables a host data block (e.g. 504) with bad wordlines to still be used rather than completely discarding the entire block and marking it as a bad block. Instead the host data block 504 with bad wordlines is referred to as a partial block. The block is partial because one or more bad wordlines limits the data that can be stored in the block and requires that data to be stored in a replacement block. In one embodiment, there may be multiple replacement blocks and they may be referred to collectively as a ReMap Zone ("RMZ"). As described, the replacement blocks provide a way to ensure that no valid data is written to bad/unusable wordlines. In one embodiment, neighboring wordlines to an unusable wordline may be deemed susceptible to failures and also identified as bad.

The replacement blocks in the RMZ are part of a subsystem that can address less than block-sized chunks. The process for utilizing partial blocks and replacement blocks includes dynamically remapping the entire or a portion of a metapage ("MP") that corresponds to the failing wordlines. The portion of the MP is smaller than a block size and the addressing for that portion is remapped to the RMZ. This wordline remap may be applicable only for bad metapages that contain the failing wordlines and may be done as and when they are written.

The remapping may work for failing wordlines that are discovered during manufacturing process as well as dynamically during run-time. The blocks that have the failing wordlines are identified as partial blocks. These blocks may be used as MLC blocks and the data in these blocks would be addressed through the GAT subsystem.

There may be at least four options that are part of the remapping process. A partial block write is for writing data (see e.g. FIG. 6). A read data back operation is for reading data (see e.g. FIG. 7). An invalidate obsolete data operations handles requests for bad wordlines. A compact obsolete space operation compacts the replacement blocks in the RMZ.

Figure 6:
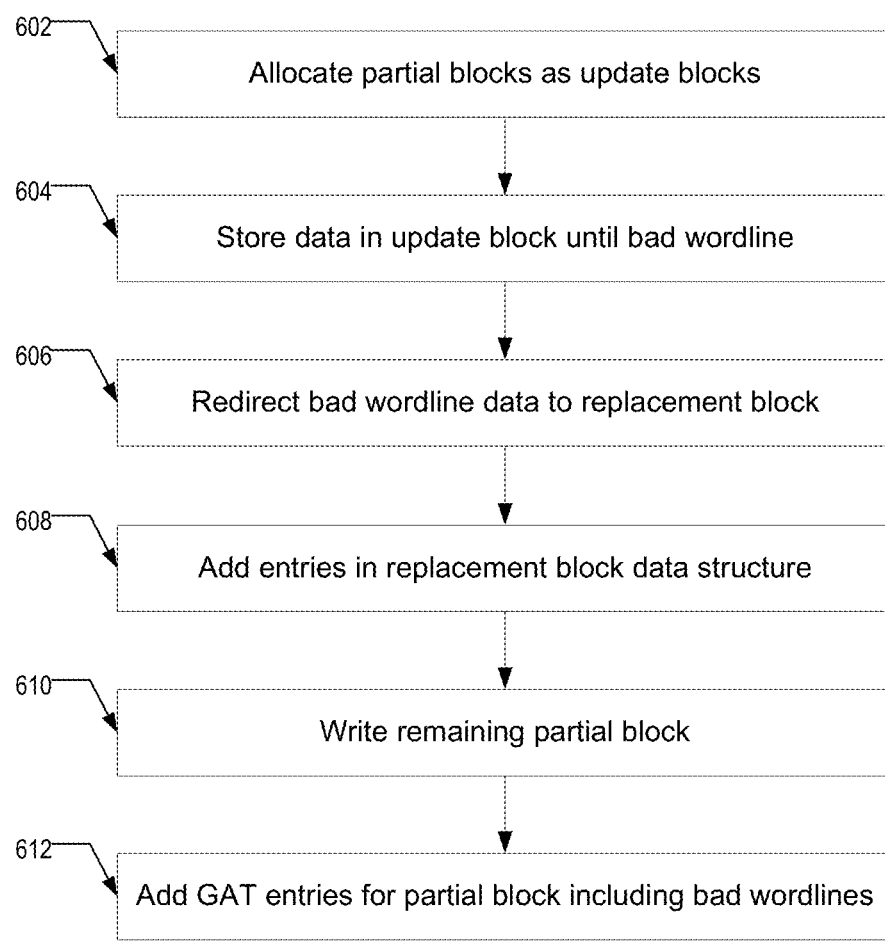
FIG. 6 is a process for writing to a partial block.

FIG. 6 is a process for writing to a partial block. In block 602, partial blocks are allocated as update blocks for writing. In block 604, data is stored in the update block until a metapage has a bad wordline. When there is a bad wordline, data that would need to be stored in the bad metapage is redirected to a replacement block in the RMZ as in block 606. In block 608, entries in the RMZ data structure are made for the redirected sectors. RMZ structure may be a list of blocks being used as replacement blocks. The wordline replacement itself may be Block x, WL y→Replacement Block a, WL b. In one embodiment, a sector is 512 bytes in size and a metapage is made up of fixed number of sectors depending on die geometry.

The rest (MPs that are not with bad wordlines) of the partial block is written in block 610. In block 612, entries in the GAT are made for the partial block including the bad wordlines. In particular, the GAT includes addresses to the RMZ for data that would have been stored in MPs including the bad wordlines.

Figure 7:
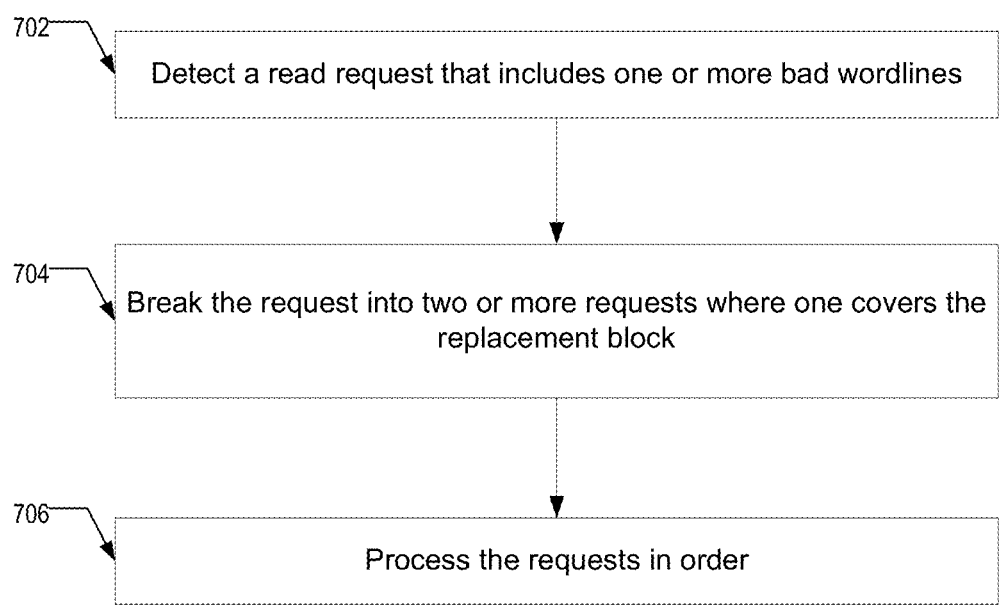
FIG. 7 is a process for reading data from a partial block.

FIG. 7 is a process for reading data from a partial block. In block 702, read request that are directed towards bad wordlines are detected. In block 704, a request to the bad wordline(s) is broken into two or more requests where one of those requests covers the redirected/RMZ writes and the other requests cover the remaining (non-RMZ) writes. In block 706, the broken up requests are processed in order.

Another operation for this remapping process would be the invalidation of obsolete data. Erase/write requests to the LBA range that covers the bad wordlines is detected. The LBA range in the RMZ would then need to be invalidated. Another operation for the remapping is a compaction process for compacting blocks in the RMZ if the RMZ is short of space. This operation may be a garbage collection operation for the replacement blocks of the RMZ. The compaction may include double the capacity of failure WL count during format time. The oldest replacement block is used as the source. The logical group ("LG") numbers from the wordline are scanned and the LG's latest location is checked to see if it is still in a block which is remapped. The wordline is moved to a target block. All new locations are committed in one iteration after the entire move.

A "computer-readable medium," "machine readable medium," "propagated-signal" medium, and/or "signal-bearing medium" may comprise any device that includes, stores, communicates, propagates, or transports software for use by or in connection with an instruction executable system, apparatus, or device. The machine-readable medium may selectively be, but not limited to, an electronic, magnetic, optical, electromagnetic, infrared, or semiconductor system, apparatus, device, or propagation medium. A non-exhaustive list of examples of a machine-readable medium would include: an electrical connection "electronic" having one or more wires, a portable magnetic or optical disk, a volatile memory such as a Random Access Memory "RAM", a Read-Only Memory "ROM", an Erasable Programmable Read-Only Memory (EPROM or Flash memory), or an optical fiber. A machine-readable medium may also include a tangible medium upon which software is printed, as the software may be electronically stored as an image or in another format (e.g., through an optical scan), then compiled, and/or interpreted or otherwise processed. The processed medium may then be stored in a processor, memory device, computer and/or machine memory.

In an alternative embodiment, dedicated hardware implementations, such as application specific integrated circuits, programmable logic arrays and other hardware devices, can be constructed to implement one or more of the methods described herein. Applications that may include the apparatus and systems of various embodiments can broadly include a variety of electronic and computer systems. One or more embodiments described herein may implement functions using two or more specific interconnected hardware modules or devices with related control and data signals that can be communicated between and through the modules, or as portions of an application-specific integrated circuit. Accordingly, the present system encompasses software, firmware, and hardware implementations.

The illustrations of the embodiments described herein are intended to provide a general understanding of the structure of the various embodiments. The illustrations are not intended to serve as a complete description of all of the elements and features of apparatus and systems that utilize the structures or methods described herein. Many other embodiments may be apparent to those of skill in the art upon reviewing the disclosure. Other embodiments may be utilized and derived from the disclosure, such that structural and logical substitutions and changes may be made without departing from the scope of the disclosure. Additionally, the illustrations are merely representational and may not be drawn to scale. Certain proportions within the illustrations may be exaggerated, while other proportions may be minimized. Accordingly, the disclosure and the figures are to be regarded as illustrative rather than restrictive.

We claim:

1. A method for remapping block and plane-based architecture memory comprising:
   in a non-volatile storage device having a controller and blocks of memory with a metapage-based addressing architecture, wherein each metapage comprises pages across two or more planes, the controller:
   allocates a group of replacement blocks that comprises a plurality of metapages;
   identifies a block with one or more bad wordlines;
   identifies metapages with the one or more bad wordlines; and
   addresses each of the metapages with one or more bad wordlines to point to a replacement metapage in the replacement blocks.

2. The method of claim 1 wherein the identified block stores valid data in wordlines other than the one or more bad wordlines.

3. The method of claim 1 further comprising the controller:
   receiving a read request for data stored in the block with the one or more bad wordlines.

4. The method of claim 3 further comprising the controller:
   retrieving data from the block requested by the read request that is stored in the block; and
   retrieving data that would have been stored in the one or more bad wordlines by redirecting to the replacement metapages in the replacement blocks.

5. The method of claim 1 further comprising the controller:
   receiving a write request for data to the one or more bad wordlines of the identified block; and
   writing data to the replacement metapages in the replacement blocks.

6. The method of claim 1 further comprising the controller:
   addressing metapages with wordlines physically neighboring the one or more bad wordlines in the identified block to point to replacement metapages in the replacement blocks.

7. The method of claim 5 further comprising the controller:
   compacting the replacement blocks when it is written to.

8. The method of claim 7, wherein the step of compacting the replacement blocks comprises a garbage collection operation on the replacement blocks.

9. The method of claim 7, wherein the compacting the replacement blocks further comprises:
   identifying an erased target block in the group of replacement blocks;
   determining whether an unerased replacement block contains non-obsolete wordlines;

moving the data in the determined replacement bock to the target block when at least one wordline is non-obsolete; and erasing the determined replacement block.

10. A method for remapping block-based architecture memory comprising:
- in a non-volatile storage device having a controller and blocks of memory with a block based addressing architecture, wherein the controller:
  - allocates a group of replacement blocks that address chunks of data less than block sized, further wherein the allocates further comprises that the controller:
  - identifies a block with one or more bad wordlines;
  - addresses the one or more bad wordlines in the identified block to point to one of the replacement blocks;
  - receives a write request for data to the block with one or more bad wordlines; and
  - compacts the replacement block when it is written to, wherein the controller compacts the replacement block by performing operations comprising:
    - identifying an erased target block in the group of replacement blocks;
    - determining whether an unerased replacement block contains non-obsolete wordlines;
    - moving the data in the determined replacement block to the target block when at least one wordline is non-obsolete; and
    - erasing the determined replacement block.

11. The method of claim 10, wherein the controller compacts the replacement block by performing a garbage collection operation on the replacement blocks.

* * * * *